United States Patent [19]

Luttmer et al.

[11] Patent Number: 4,876,222

[45] Date of Patent: Oct. 24, 1989

[54] SEMICONDUCTOR PASSIVATION

[75] Inventors: Joseph D. Luttmer, Richardson; D. Dawn Little, Euless, both of Tex.

[73] Assignee: Texas Instrument Incorporated, Dallas, Tex.

[21] Appl. No.: 251,950

[22] Filed: Sep. 28, 1988

Related U.S. Application Data

[62] Division of Ser. No. 101,056, Sep. 25, 1987, abandoned.

[51] Int. Cl.[4] .................... H01L 21/00; H01L 21/02; H01L 21/306; H01L 21/31
[52] U.S. Cl. .................................. 437/225; 437/235; 148/33.3
[58] Field of Search ................. 437/225, 235, 237

[56] References Cited

U.S. PATENT DOCUMENTS

| 4,084,044 | 4/1978 | Heller et al. | 29/623.1 X |
| 4,256,544 | 3/1981 | Kazacos et al. | 204/2.1 |
| 4,447,469 | 5/1984 | Peters | 437/234 |
| 4,543,511 | 9/1985 | Ellis et al. | 357/90 X |
| 4,547,395 | 10/1985 | Hail et al. | 252/500 |
| 4,632,886 | 12/1986 | Teherani et al. | 204/34.5 |
| 4,637,969 | 1/1987 | Skotheim et al. | 429/111 |
| 4,726,885 | 2/1988 | Teherani et al. | 204/34.5 |

FOREIGN PATENT DOCUMENTS

| 55-105384 | 8/1980 | Japan | 357/30 B |
| 59-56126 | 3/1984 | Japan | 357/30 B |

OTHER PUBLICATIONS

Mellor, Inorganic and Theoretical Chemistry, vol. II, Supplement II, The Alkali Metals, p. 980–993, 1961.
Nemirovsky, Y., Anodic Sulfide Films on $Hg_{1-x}Cd_xTe$, Appl. Phys. Lett. 44(4), 2/15/84, pp. 443–444.
Nemirovsky, Y., Interface of p-type $Hg_{1-x}Cd_xTe$ Passivated with Native Sulfides, J. Appl. Phys. 58(1), 7/1/85, pp. 366–373.

Primary Examiner—Brian E. Hearn
Assistant Examiner—B. Everhart
Attorney, Agent, or Firm—Ferdinand M. Ramano; Carlton H. Hoel; Mel Sharp

[57] ABSTRACT

A method of passivation of $Hg_{1-x}Cd_xTe$ and similar semiconductors by chemical reaction to either sulfide or selenide or a combination of both with an oxidizer such as polysulfide or polyselenide ions in solution.

4 Claims, 1 Drawing Sheet

SEMICONDUCTOR PASSIVATION

This application is a division of application Ser. No. 101,056, filed 09/25/87, now abandoned.

BACKGROUND OF THE INVENTION

1. Field of the Invention.

The present invention relates to passivation of semiconductor surfaces, and, more particularly, to passivation of II-VI compound semiconductors such as $Hg_{1-x}Cd_xTe$.

2. Description of the Related Art.

Alloys of mercury telluride and cadmium telluride, generically denoted $Hg_{1-x}Cd_xTe$, are extensively employed as photosensitive semiconductors for infrared radiation detection. For example, $Hg_{.8}Cd_{.2}Te$ has a bandgap of about 0.1 eV which corresponds to a photon wavelength of 12 $\mu$m and $Hg_{.73}Cd_{.27}Te$ has a bandgap of about 0.24 eV which corresponds to a photon wavelength of 5 $\mu$m; these two wavelengths are in the two atmospheric windows of greatest interest for infrared detectors. In particular, p-n junction $Hg_{1-x}Cd_xTe$ photodiode arrays have long been used (see, for example, Lorenze, U.S. Pat. No. 4,286,278), and extrinsic p type $Hg_{1-x}Cd_xTe$ has potential application in infrared focal plane MIS detector arrays operating in the 10–12 $\mu$m wavelength window. (Note that intrinsic p type $Hg_{1-x}Cd_xTe$, whose doping is presumably dominated by mercury vacancies, was recently found to have midgap recombination centers proportional in concentration to the shallow acceptors; see C.Jones et al, 3 J.Vac.Sci.Tech.A 131 (1985). These recombination centers shorten minority carrier lifetimes and are sources of recombination-generation noise; and thus extrinsic p type $Hg_{1-x}Cd_xTe$ is preferred to intrinsic p type.) Such detectors are fabricated in large area $Hg_{1-x}Cd_xTe$ which may be grown by LPE, MOCVD, MBE or bulk techniques and are operated typically at liquid nitrogen temperatures to limit background noise.

Passivation of $Hg_{1-x}Cd_xTe$ prior to detector fabrication is necessary to avoid surface contamination by residues of various processing steps; such contamination affects the electrical characteristics of the detectors, for example, the photocarrier lifetime and stability. Analogous passivation of silicon for integrated circuits fabrication is typically achieved by growth of thermal oxides at temperatures about 1,000° C.; however, thermal growth of oxides on $Hg_{1-x}Cd_xTe$ is not feasible due to the out diffusion of mercury at even moderate temperatures. Consequently, passivation of $Hg_{1-x}Cd_xTe$ by deposition of zinc sulfide or silicon dioxide has been used, but such passivation yields detectors that degrade (surface state density and accumulated surface charge vary and give unstable device characteristics) when subjected to temperatures over 70° C. An improvement is passivation by anodic oxide: oxides of mercury, cadmium, and tellurium are grown on the surface of $Hg_{1-x}Cd_xTe$ electrochemically in a KOH solution; see Catagnus, U.S. Pat. No. 3,977,018. Anodic oxide is also temperature sensitive and yields detectors that degrade at about 80° C. Further, even extended storage at room temperature degrades such detectors.

Anodic sulfidization has also been proposed; see Teherani et al, U.S. Pat. No. 4,632,886 in which sulfides are grown on the surface of $Hg_{1-x}Cd_xTe$ electrochemically in a $Na_2S$ solution. These sulfides are stable up to 100° C. and provide an improvement over anodic oxides. Similarly, selenides can be anodically grown. However, the anodic growth process requires complex electronic instrumentation and a means of bussing current between the instrumentation and the $Hg_{1-x}Cd_xTe$ substrate submersed in the sulfide or selenide solution. Typically, a metal probe makes the electrical contact to the $Hg_{1-x}Cd_xTe$ substrate, and this damages a portion of the substrate. Further, the resistive losses in the contacts, leads, and substrate yield a nonuniform sulfide or selenide passivation layer. These problems are magnified in large area substrates or a batch process with multiple substrates.

Copending U.S. patent application Ser. No. 824,897, filed Jan. 31, 1986, discloses a process of converting anodically-grown oxides to sulfides or selenides by immersion of oxide-coated substrates in sodium sulfide or selenide solutions. The oxides (typically $HgTeO_3$, $CdTeO_3$, and $TeO_2$) are converted to sulfides or selenides (primarily CdS or CdSe) plus soluble complexes; the thickness of the resulting sulfide or selenide layer is typically about 40% of the thickness of the original oxide layer prior to conversion. But this process still requires the anodic oxide growth and its problems.

Thus it is a problem to provide a passivation for $Hg_{1-x}Cd_xTe$ that avoids detector degradation at temperatures somewhat above room temperature and is uniform and simple to fabricate.

SUMMARY OF THE INVENTION

The present invention provides direct chemical formation of sulfides or selenides on the surface of II-VI compound semiconductors such as $Hg_{1-x}Cd_xTe$ without use of an electrochemical process. Preferred embodiments employ solutions containing polysulfide or polyselenide ions.

This direct chemical sulfidization or selenidization avoids any electrochemical procesing but provides a stable sulfide or selenide passivation layer for $Hg_{1-x}Cd_xTe$ and solves the problems of the known processes.

BRIEF DESCRIPTION OF THE DRAWINGS

The drawings are schematic for clarity.

DESCRIPTION OF THE PREFERRED EMBODIMENTS

In the electrochemical sulfidization of $Hg_{1-x}Cd_xTe$ in a sulfide solution the following oxidation (anodization) of the $Hg_{1-x}Cd_xTe$ occurs:

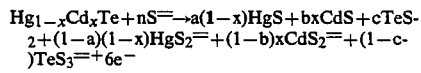

The generated electrons are bussed from the $Hg_{1-x}Cd_xTe$ substrate through an electrical probe contact to an external circuit, and the reaction products grow or precipitate on the $Hg_{1-x}Cd_xTe$ surface or diffuse into the electrolyte as soluble ionic species. Typically and the net reaction is essentially:

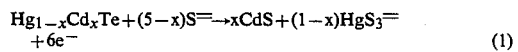

(1)

Electrochemical selenidization involves analogous reactions.

The first preferred embodiment method sulfidizes $Hg_{1-x}Cd_xTe$ in a solution of potassium disulfide and potassium sulfide in water; the disulfide ion oxidizes the $Hg_{1-x}Cd_xTe$ and itself is reduced to sulfide ions. The reaction is:

$$Hg_{1-x}Cd_xTe + (5-x)S^= + 3S_2^= \rightarrow xCdS + (1-x)HgS_2^= + TeS_3^= + 6S^= \qquad (2)$$

Note that S= has been left on both sides of equation (2) for clarity; the oxidation is the same as equation (1) and the reduction is:

$$6e^- + 3S_2^= \rightarrow 6S^= \qquad (3)$$

Thus no electrical contacts are needed, and the solution provides the reaction balance. The disulfide ion (or polysulfide ion in general) has sufficient electrochemical potential to oxidize the $Hg_{1-x}Cd_xTe$ to form stable sulfides (primarily CdS) without also oxidizing the other components of the solution. And the reaction products likewise do not degrade either the sulfide passivation layer being grown or the other components of the solution. The reaction kinetics yield good process control for the growth; in particular, the oxidizing strength of the solution may be adjusted by varying the disulfide to sulfide ion ratio and concentrations, the solution temperature, and the concentration of species that affect reaction kinetics such as ethylene glycol. The following table illustrates such variations (the concentrations are Molar and the solution percents are by volume):

| $S_2^=$ Conc | $S^=$ Conc | Glycol % | Water % | Temp (°C.) | Growth Rate (Å/Min) |
|---|---|---|---|---|---|
| 0.04 | 0.02 | 80 | 20 | 60 | 0.7 |
| 0.04 | 0.16 | 80 | 20 | 60 | 2.0 |
| 0.04 | 0.02 | 0 | 100 | 60 | 4.0 |
| 0.13 | 0.07 | 0 | 100 | 60 | 8.3 |
| 0.13 | 0.07 | 0 | 100 | 50 | 3.9 |
| 0.13 | 0.07 | 0 | 100 | 23 | 0.24 |

For a $Hg_{1-x}Cd_xTe$ substrate of size 20 mm by 5 mm by 0.5 mm thickness, a 200 Å thick sulfide passivation layer can be grown by immersion in a 0.13 M $K_2S_2$ and 0.07 M $K_2S$ water solution at 60° C. for about 25 minutes. The substrate may be waxed to a support plug and stirred about in the disulfide/sulfide solution.

The electrical and chemical characteristics of sulfide layers grown on $Hg_{1-x}Cd_xTe$ by the first preferred embodiment method are very similar to anodic sulfide and sulfide formed by chemically conversion of oxide layers on $Hg_{1-x}Cd_xTe$.

Figure 1:
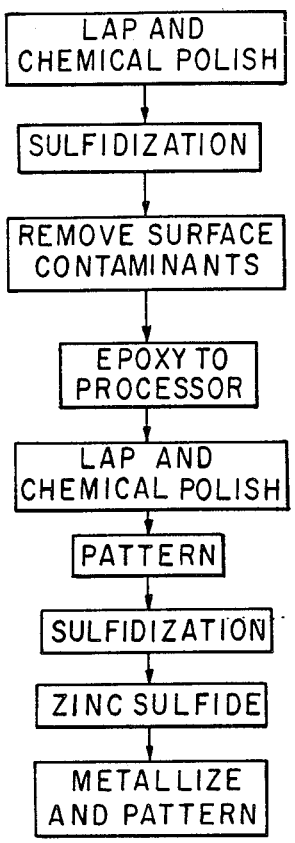
FIG. 1 is a flow chart of a fabrication process for an array of $Hg_{1-x}Cd_xTe$ photodetectors (an infrared imager)
Figure 2:
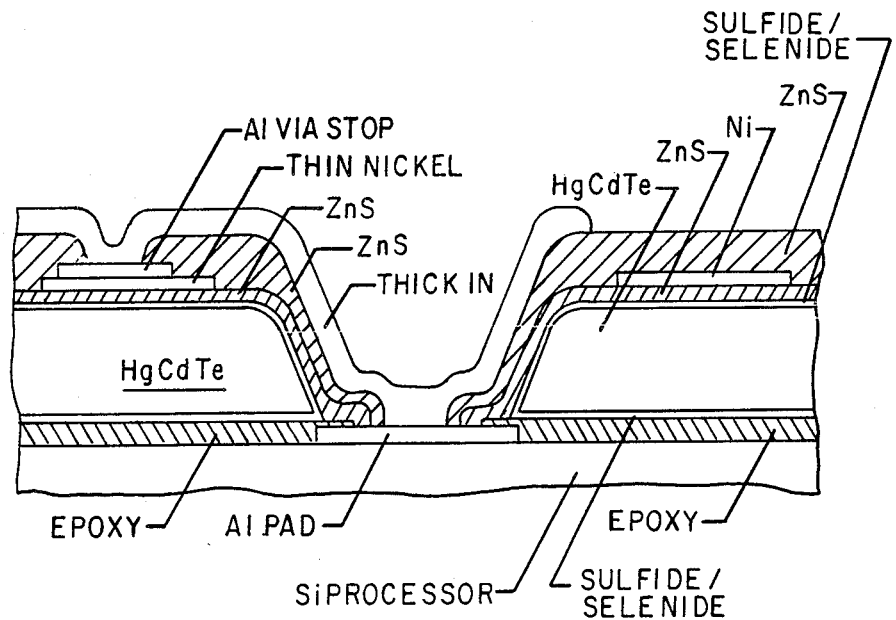
FIG. 2 is a partial cross sectional view of a single photodetector in an array.

FIG. 1 is a flow chart incorporating the preferred embodiment sulfidization in the fabrication of a hybrid array of $Hg_{1-x}Cd_xTe$ MIS photodetectors, and FIG. 2 illustrates a single detector of such an array in partial cross sectional view. The fabrication includes the following steps. First, a single crystal n type $Hg_{1-x}Cd_xTe$ slice (typically 20 mm by 5 mm by 0.5 mm) is waxed to a lapping plug on one of its 20 mm by 5mm surfaces and is lapped (with for example, a paste of five micron alumina particles followed by three micron particles) to remove any damage to the other 20mm by 5mm surface resulting from the sawing of an ingot of $Hg_{1-x}Cd_xTe$ into slices. Next, the lapped surface of the slice is chemically polished with a 0.5% solution of bromine in methanol to remove any damage arising from the mechanical lapping. After cleaning, the polished surface is sulfidized in a disulfide/sulfide solution (first preferred embodiment) or selenidized (third preferred embodiment) to a thickness of about 200 Å which forms a passivation layer. Next, the $Hg_{1-x}Cd_xTe$ slice is epoxied to a silicon processor chip with the passivated surface making the contact (the lower layer of sulfide or selenide in FIG. 2). The silicon chip is now waxed to a lapping plug and the exposed 20 mm by 5 mm surface of the $Hg_{1-x}Cd_xTe$ slice is lapped down until the $Hg_{1-x}Cd_xTe$ slice is about 75 microns thick; this is followed by chemical polishing down to a slice thickness of about 12 microns. Now the exposed $Hg_{1-x}Cd_xTe$ is patterned and etched with bromine-methanol to form an array of $Hg_{1-x}Cd_xTe$ detectors areas; further processing (such as ion milling) opens vias for each of the detector areas to connect with an adjacent aluminum contact pad on the silicon processor chip. Next, the $Hg_{1-x}Cd_xTe$ is again sulfidized or selenized to a sulfide or selenide thickness of 200 Å. This passivation is followed by deposition of 2,500 Å of zinc sulfide; the two layer insulator (sulfide or selenide plus zinc sulfide) forms the MIS gate insulator. Metal deposition with patterning and etching to define the gates comes next, and is followed by further zinc sulfide, and interconnections to complete the array of detectors.

Other types of infrared detectors and arrays of detectors incorporate $Hg_{1-x}Cd_xTe$ with passivation layers of various kinds, and these detectors and arrays may similarly be fabricated with substitution of their passivation steps by growth of a sulfide or selenide with polysulfide or polyselenide ions.

A second preferred embodiment method uses sodium polysulfides in solution to sulfidize $Hg_{1-x}Cd_xTe$. The polysulfides are formed by adding elemental sulfur to a sodium sulfide solutions:

$$Na_2S + nS \rightarrow Na_2S_{n+1}$$

A third preferred embodiment method is analogous to the first preferred embodiment except the growth solution is 0.1 M $Na_2Se_2$ in 20% water and 80% ethylene glycol. The instability of the selenide ion in air requires use of apparatus such as glove bags under nitrogen atmosphere to exclude oxygen from contact with the selenide solution. Again, tellurium and mercury are to lost to the solution and the passivation layer is primarily CdSe with some HgSe. As with sulfide, the concentration of selenide ions, polyselenide ions and organic solvents in the growth solution affects growth rate.

The general reaction including the preferred embodiment methods' reactions is oxidation of $Hg_{1-x}Cd_xTe$ as in equation (1) plus reduction of an oxidizer:

$$6e^- + mOX^{+p} \rightarrow nRED^{+q} \quad nq = mp - 6$$

where OX is the oxidized state of the oxidizing agent and RED is its reduced state. Thus in the preferred embodiments the oxidizer is the polysulfide or polyselenide ion as shown in equation (3). Other oxidizers may be used, but various reaction products are formed (for example, hydrogen peroxide yields $2S^= + H_2O_2 \rightarrow S_2^= + 2OH^{31}$) which may be incompatible with the passivation film (primarily CdS or CdSe) or the solution components, and strong oxidizers may oxidize the sulfide ions to sulfate ions and deplete the solution of sulfides.

In contrast, the preferred embodiment methods use polysulfide or polyselenide ions as the oxidizer and these yield sulfide or selenide ions as reaction products which replenish the solution. Also, adding elemental sulfur to a sulfide solution to form the polysulfide is quite convenient.

MODIFICATIONS AND ADVANTAGES

Various modifications of the preferred embodiment passivation methods and devices may be made while retaining the feature of chemically forming sulfides or selenides of $Hg_{1-x}Cd_xTe$ or similar materials such as $Hg_{1-x}Mn_xTe$ and $Hg_{1-x-y}Cd_xTe$ with oxidizers such as polysulfides and polyselenides in solution to form a passivating layer.

For example, various size slices and ingots of $Hg_{1-x}Cd_xTe$ can be passivated in various solutions with available polysulfide or polyselenide ions, or even a solution with both polysulfide and polyselenide ions such as 0.5M $Na_2Se_2$ plus 0.1M $Na_2S_4$ in 20% water and 80% ethylene glycol.

Further, the method could also be applied to thin films of $Hg_{1-x}Cd_xTe$ or similar materials such as LPE or VPE films on various substrates such as CdTe, CdZnTe, and CdMnTe, as well as other compound semiconductors. Such substrates with doped films and doped bulk $Hg_{1-x}Cd_xTe$ can be incorporated into various infrared detectors and arrays to provide the photosensitive semiconductor. Detectors employing photodiodes, CCDs, CIDs, CIM, as well as the hybrid array of FIG. 2 all can use the sulfide or selenide passivation.

The advantages of chemical formation of sulfide or selenide passivation include the temperature stability, simplicity of the process, the uniformity and control of the final converted layer thickness.

What is claimed is:

1. A method of passivating a $Hg_{1-x}Cd_xTe$ substrate, comprising the step of:
   (a) growing a passivating layer on said substrate by chemical reaction in the absence of an applied electrochemical current in a solution containing ions from the group consisting polysulfide, polyselenide, and a combination of the two.
2. The method of claim 1, wherein:
   (a) said solution includes water.
3. The method of claim 1, wherein:
   (a) said solution includes ethylene glycol.
4. The method of claim 1, wherein:
   (a) said ions are provided by a member of the group consisting of alkali polysulfides, alkali polyselenides, and a combination of alkali polysulfides and polyselenides.

* * * * *